(12) United States Patent
Altman (10) Patent No.: US 8,797,741 B2
(45) Date of Patent: Aug. 5, 2014

(54) MAINTAINING THERMAL UNIFORMITY IN MICRO-CHANNEL COLD PLATES WITH TWO-PHASE FLOWS

(75) Inventor: David H. Altman, Framingham, MA (US)

(73) Assignee: Raytheon Company, Waltham, MA (US)

(*) Notice: Subject to any disclaimer, the term of this patent is extended or adjusted under 35 U.S.C. 154(b) by 482 days.

(21) Appl. No.: 12/909,347

(22) Filed: Oct. 21, 2010

(65) Prior Publication Data

US 2012/0097374 A1 Apr. 26, 2012

(51) Int. Cl.
*H05K 7/20* (2006.01)
*F28F 7/00* (2006.01)
*F28D 15/00* (2006.01)
*B21D 53/02* (2006.01)

(52) U.S. Cl.
USPC ............ 361/702; 361/704; 361/711; 361/719; 361/720; 165/80.2; 165/80.4; 165/104.33; 29/890.03

(58) Field of Classification Search
USPC ......... 361/702, 704, 711, 719, 720; 165/80.2, 165/80.4, 104.33; 29/890.03
See application file for complete search history.

(56) References Cited

U.S. PATENT DOCUMENTS

| | | | | |
|---|---|---|---|---|
| 4,315,300 A | * | 2/1982 | Parmerlee et al. | 361/703 |
| 4,962,444 A | * | 10/1990 | Niggemann | 361/702 |
| 5,005,640 A | * | 4/1991 | Lapinski et al. | 165/170 |
| 5,099,910 A | * | 3/1992 | Walpole et al. | 165/80.4 |
| 5,170,319 A | * | 12/1992 | Chao-Fan Chu et al. | 361/689 |
| 5,424,916 A | * | 6/1995 | Martin | 361/698 |
| 5,901,037 A | * | 5/1999 | Hamilton et al. | 361/699 |
| 5,998,240 A | * | 12/1999 | Hamilton et al. | 438/122 |
| 6,301,109 B1 | * | 10/2001 | Chu et al. | 361/690 |
| 6,337,794 B1 | * | 1/2002 | Agonafer et al. | 361/690 |
| 6,386,277 B1 | * | 5/2002 | Wattelet et al. | 165/164 |
| 6,469,671 B1 | * | 10/2002 | Pluymers et al. | 343/702 |
| 6,536,516 B2 | * | 3/2003 | Davies et al. | 165/170 |
| 6,550,263 B2 | * | 4/2003 | Patel et al. | 62/259.2 |
| 6,578,626 B1 | * | 6/2003 | Calaman et al. | 165/80.4 |
| 6,679,315 B2 | * | 1/2004 | Cosley et al. | 165/80.4 |

(Continued)

OTHER PUBLICATIONS

X. Tu, P.S. Hrnjak, C.W. Bullard, Refrigerant 134a liquid flow through micro-scale short tube orifices with/without phase change, Experimental Thermal and Fluid Science, Jul. 4, 2005, pp. 253-262.

(Continued)

*Primary Examiner* — Bradley Thomas
(74) *Attorney, Agent, or Firm* — Daly, Crowley, Mofford & Durkee, LLP (57) ABSTRACT

A cold plate system including, in one embodiment, first and second flow paths extending from a common inlet to a common outlet, wherein the first and second flow paths enable two-phase coolant flow under pressure through micro-channels for cooling heat loads on the cold plate system, first and second orifices disposed in the first flow path on an inlet side of the first flow path, and a third orifice spaced from a fourth orifice, the third and fourth orifices disposed in the second flow path on an inlet side of the second flow path, wherein the first and second orifices in the first flow path and the third and fourth orifices in the second flow path minimize a difference in mass flow rate between the first and second flow paths when the first and second flow paths are exposed to different heat loads.

20 Claims, 10 Drawing Sheets

(56) References Cited

U.S. PATENT DOCUMENTS

| | | | |
|---|---|---|---|
| 6,828,675 B2 * | 12/2004 | Memory et al. | 257/714 |
| 6,903,931 B2 * | 6/2005 | McCordic et al. | 361/711 |
| 6,929,058 B2 * | 8/2005 | Liu et al. | 165/80.3 |
| 6,986,382 B2 * | 1/2006 | Upadhya et al. | 165/80.4 |
| 6,988,534 B2 * | 1/2006 | Kenny et al. | 165/80.4 |
| 6,994,151 B2 * | 2/2006 | Zhou et al. | 165/80.4 |
| 6,994,829 B2 * | 2/2006 | Whyatt et al. | 422/177 |
| 7,000,684 B2 * | 2/2006 | Kenny et al. | 165/80.4 |
| 7,017,654 B2 * | 3/2006 | Kenny et al. | 165/80.4 |
| 7,104,312 B2 * | 9/2006 | Goodson et al. | 165/80.4 |
| 7,139,172 B2 * | 11/2006 | Bezama et al. | 361/699 |
| 7,182,634 B2 | 2/2007 | Tran | |
| 7,218,519 B2 | 5/2007 | Prasher et al. | |
| 7,259,965 B2 | 8/2007 | Chang et al. | |
| 7,265,979 B2 | 9/2007 | Erturk et al. | |
| 7,272,006 B2 | 9/2007 | Mongia et al. | |
| 7,317,615 B2 | 1/2008 | Chang et al. | |
| 7,344,576 B2 * | 3/2008 | TeGrotenhuis et al. | 55/319 |
| 7,352,581 B2 * | 4/2008 | Tomioka | 361/702 |
| 7,445,340 B2 | 11/2008 | Conner et al. | |
| 7,471,515 B2 | 12/2008 | Chang et al. | |
| 7,511,372 B2 | 3/2009 | Chiu | |
| 7,540,616 B2 | 6/2009 | Conner | |
| 7,547,582 B2 | 6/2009 | Brunschwiler et al. | |
| 7,599,184 B2 | 10/2009 | Upadhya et al. | |
| 7,715,194 B2 | 5/2010 | Brewer et al. | |
| 7,775,261 B2 * | 8/2010 | Valenzuela | 165/104.26 |
| 7,808,781 B2 * | 10/2010 | Colgan et al. | 361/699 |
| 7,830,664 B2 * | 11/2010 | Campbell et al. | 361/699 |
| 2002/0159237 A1 | 10/2002 | Patel et al. | 361/719 |
| 2003/0205054 A1 | 11/2003 | Nori et al. | |
| 2004/0068991 A1 * | 4/2004 | Banney et al. | 62/3.7 |
| 2004/0069451 A1 * | 4/2004 | Meyer | 165/80.2 |
| 2004/0099712 A1 * | 5/2004 | Tonkovich et al. | 228/193 |
| 2004/0188064 A1 * | 9/2004 | Upadhya et al. | 165/80.3 |
| 2004/0247986 A1 * | 12/2004 | Takeguchi et al. | 429/38 |
| 2005/0117301 A1 * | 6/2005 | Prasher et al. | 361/699 |
| 2005/0199372 A1 * | 9/2005 | Frazer et al. | 165/80.4 |
| 2005/0264997 A1 | 12/2005 | Prasher et al. | |
| 2005/0269061 A1 * | 12/2005 | Brewer et al. | 165/80.4 |
| 2005/0276014 A1 * | 12/2005 | Prasher et al. | 361/687 |
| 2005/0285261 A1 | 12/2005 | Prasher et al. | |
| 2006/0096738 A1 * | 5/2006 | Kang et al. | 165/80.4 |
| 2006/0137860 A1 * | 6/2006 | Prasher | 165/104.33 |
| 2006/0142401 A1 | 6/2006 | Tonkovich et al. | |
| 2007/0201210 A1 * | 8/2007 | Chow et al. | 361/704 |
| 2007/0246106 A1 | 10/2007 | Tonkovich et al. | |
| 2007/0279861 A1 * | 12/2007 | Doll | 361/687 |
| 2007/0295480 A1 * | 12/2007 | Campbell et al. | 165/80.4 |
| 2008/0073061 A1 * | 3/2008 | Dias et al. | 165/80.4 |
| 2008/0259566 A1 * | 10/2008 | Fried | 361/699 |
| 2008/0296005 A1 * | 12/2008 | Taras et al. | 165/173 |
| 2009/0014360 A1 * | 1/2009 | Toner et al. | 209/208 |
| 2009/0161312 A1 * | 6/2009 | Spearing et al. | 361/679.47 |
| 2009/0250195 A1 * | 10/2009 | Yoshida et al. | 165/80.3 |
| 2010/0096016 A1 | 4/2010 | Davis | |
| 2010/0214749 A1 * | 8/2010 | Lee | 361/754 |
| 2011/0056668 A1 * | 3/2011 | Taras et al. | 165/174 |
| 2011/0114289 A1 * | 5/2011 | Altman et al. | 165/80.4 |
| 2011/0198816 A1 * | 8/2011 | Vafai et al. | 277/650 |
| 2011/0232879 A1 * | 9/2011 | Zaffetti et al. | 165/104.28 |
| 2012/0087088 A1 * | 4/2012 | Killion et al. | 361/697 |

OTHER PUBLICATIONS

Brandon Schneider, Ali Kosar Yoav Peles, Hydrodynamic cavitation and boiling in refrigerant (R-123) flow inside microchannels, International Journal of Heat and Mass Transfer, Mar. 6, 2007, pp. 2838-2854.

W. Vance Payne, Dennis L. O'Neal, A Mass Flowrate Correlation for Refrigerants and Refrigerant Mixtures Flowing Through Short Tubes, 2004, pp. 1-14.

Jung Eung Park, John R. Thome, Bruno Michel, Effect of Inlet Orifice on Saturated CHF and Flow Visualization in Multi-microchannel Heat Sinks, 25$^{th}$ IEEE Semi-Therm Symposium, 2009, pp. 1-8.

G. Kojasoy, F. Landis, P. Kwame-Mensah, C.T. Chang, Two-Phase Pressure Drop in Multiple Thick-and Thin-Orifice Plates, 1997, pp. 347-358.

Yongchan Kim, Dennis L. O'Neal, The effect of oil on the two-phase critical flow of Refrigerant 134a through short tube orifices, vol. 37, No. 9, Nov. 17, 1993, pp. 1377-1385.

G.M. Singh, P.S. Hrnjak, C.W. Bullard, Flow of Refrigerant 134a Through Orifice Tubes, vol. 7, No. 3, Jul. 2001, pp. 245-262.

Notification of Transmittal of the International Search Report and the Written Opinion of the International Searching Authority, or the Declaration, PCT/US2011/052073, Date of mailing Mar. 26, 2012, 4 pages.

Written Opinion of the International Searching Authority, PCT/US2011/052073, Date of mailing Mar. 26, 2012, 6 pages.

International Preliminary Report on Patentability for PCT/US2011/052073 dated May 2, 2013.

* cited by examiner

*FIG. 1A*

PRIOR ART

*FIG. 1B*

PRIOR ART

MAINTAINING THERMAL UNIFORMITY IN MICRO-CHANNEL COLD PLATES WITH TWO-PHASE FLOWS

BACKGROUND

As is known in the art, many applications involving semiconductor devices require mechanisms to dissipate heat. For example, fans can be used to force air flow for enhancing heat dissipation. Heat sinks can increase surface area to transfer heat away from devices. Known systems can also include liquid cooling by circulating a fluid to dissipate heat.

Micro-channel cold plates utilizing phase-change heat removal have emerged as a viable technique for coping with increased dissipation density in semiconductor devices. However, the increased pressure loss associated with micro-channels necessitates shortening of flow paths and forces flow path parallelism to achieve optimal thermal and hydraulic performance.

A variety of complex, active component flow-balancing devices for two-phase flows are commonly used in the HVAC&R (Heating, Ventilation, Air Conditioning & Refrigeration) industry. However, such mechanisms include relatively large, complicated mechanical elements (springs, diaphragms, etc.) that are not suitable for reliable integration as part of a monolithic cold plate.

Figure 1A:
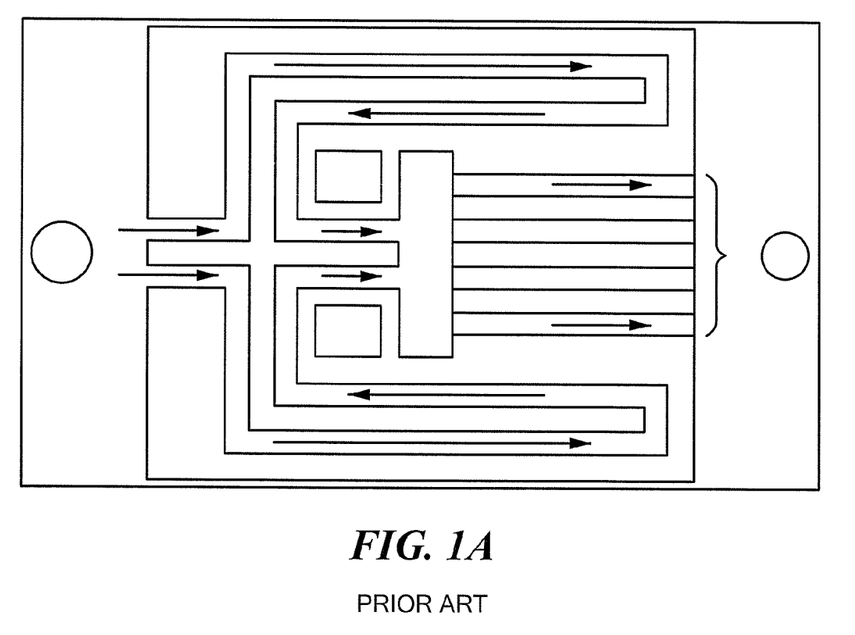
FIGS. 1A and 1B show prior art micro-channel cooling plates.
Figure 1B:
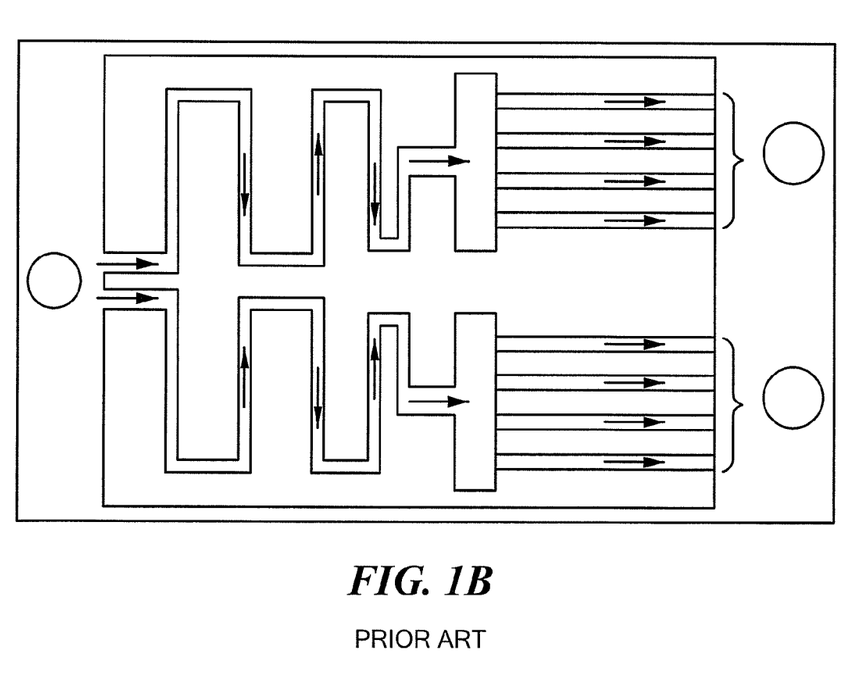

Conventional implementations of parallel micro-channel phase-change cooling schemes for spatially varying thermal loads have design specific flow arrangements, which limit applicability and increase complexity. U.S. Pat. No. 7,218,519 to Prasher et al., which is incorporated herein by reference, discloses micro-channel cold plates having channels designed with a priori knowledge of high and low heat load locations. Thus, the cold plates disclosed by Prasher are limited to particular board layouts with integrated circuits, such as microprocessors, in given locations. FIGS. 1A and 1B show implementations from Prasher having channels for low and high heat areas defined by the locations of microprocessors. Thus, Prasher discloses a cold plate that is limited to one particular board layout.

Figure 2:
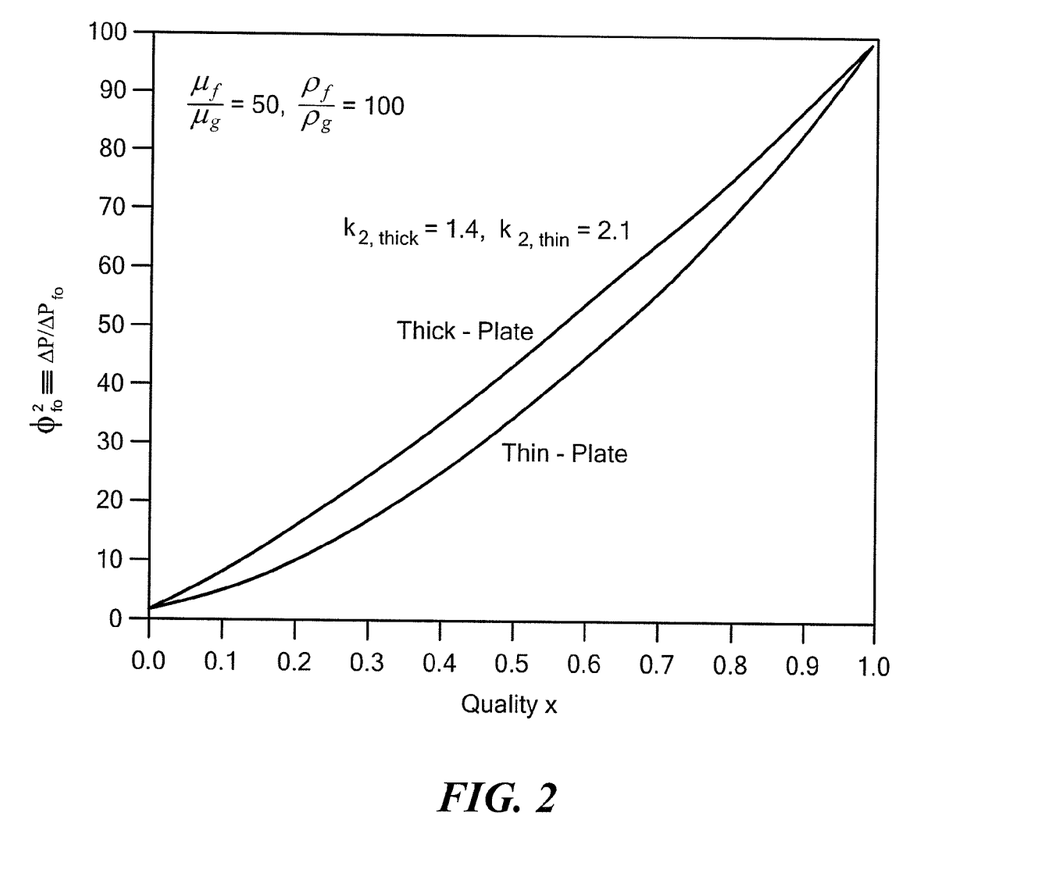
FIG. 2 is a prior art graphical representation of quality versus pressure drop.

As is further known in the art, coolant flow misdistribution in phase change cooling systems with varying heat loads on parallel flow paths is the result of uneven vapor fraction at the flow path exit. When one flow path dissipates more heat than another path, the total volumetric flow of vapor in that path is greater on average, thereby incurring a larger pressure drop. Since parallel paths must have equivalent pressure drops, the flow rates for the flow paths dissipating less heat increase, while the flow rates for paths dissipating more heat decrease, until an equivalent pressure drop across all paths is established to restore equilibrium. The consequence is that the flow paths with larger heat loads can be starved of fluid flow, degrading thermal performance. Relatively small amounts of vapor can significantly impact pressure drops. The phenomenon of pressure drop multiplication due to vapor fraction is illustrated in FIG. 2, from Kojasoy, G. et al., "Two-Phase Pressure Drop in Multiple Thick and Thin Orifice Plates," Experimental and Fluid Science, 1997, 15:347-358.

SUMMARY

The present invention provides exemplary embodiments of a cold plate having parallel flow paths with respective sets of orifices spaced and sized to minimize misdistribution of coolant in the presence of varying heat loads. With this arrangement, flow paths with larger heat loads are not starved of flow as in conventional micro-channel cold plates. While exemplary embodiments of the invention are shown and described in conjunction with particular applications, geometries and configurations, it is understood that invention is applicable to cooling in general, in which it is desirable to maximize the cooling performance of cold plates.

In one aspect of the invention, a cold plate system comprises first and second flow paths extending from a common inlet to a common outlet, the first and second flow paths being hydraulically parallel, wherein the first and second flow paths enable two-phase coolant flow under pressure through micro-channels for cooling heat loads on the cold plate system, a first orifice spaced from a second orifice, the first and second orifices disposed in the first flow path on an inlet side of the first flow path, and a third orifice spaced from a fourth orifice, the third and fourth orifices disposed in the second flow path on an inlet side of the second flow path, wherein the first and second orifices in the first flow path and the third and fourth orifices in the second flow path minimize a difference in mass flow rate between the first and second flow paths when the first and second flow paths are exposed to different heat loads.

The system can further include one or more of the following features: the cold plate system is passive, for a selected temperature and pressure, the first orifice is sized to not cause flashing of the liquid coolant and the second orifice is sized to flash subcooled liquid coolant to a two-phase flow, a further orifice in the first flow path, the second orifice is located at an inlet to a micro-channel, a slot for coupling the cold plate system to circuit card, the circuit card forms a part of a radar system, and the first and second orifices are spaced to minimize the difference in mass flow rate between the first and second flow paths when the first and second flow paths are exposed to different heat loads.

In another aspect of the invention, a cold plate system comprises: a first flow path, a first orifice disposed in the first flow path, the first orifice having a fluid inlet and a fluid outlet into a region, a second orifice disposed at an inlet of a first micro-channel coupled to the region, a third orifice disposed at an inlet of a second micro-channel coupled to the region, wherein the first flow path and the first and second micro-channels enable two-phase coolant flow under pressure through the first and second micro-channels to minimize a difference in mass flow rate between the first and second micro-channels when the first and second flow micro-channels are exposed to different heat loads.

The system can further include one or more of the following features: the first and second micro-channels are sized to generate flashing bubbles to maximize cooling for a selected pressure and temperature, the first and second micro-channels are hydraulically parallel, the system is passive, and a slot for coupling the cold plate system to circuit card.

BRIEF DESCRIPTION OF THE DRAWINGS

The foregoing features of this invention, as well as the invention itself, may be more fully understood from the following description of the drawings in which.

DETAILED DESCRIPTION

Before describing exemplary embodiments of the invention in detail, some information is provided. It is known that for micro-channel cold plates an increase in vapor percent in a flow path due to a higher heat load results in an increased pressure drop, which reduces the mass flow rate of the coolant. Pressure and temperature determine a change in phase from liquid to vapor, i.e., the boiling point of a liquid. A subcooled liquid, also referred to as a compressed liquid, is a liquid at a temperature lower than the saturation temperature at a given pressure. Liquid flashing occurs when a saturated liquid stream undergoes a reduction in pressure to below the vapor pressure, creating vapor without external heat addition. Flashing can occur in response to pressure drops. Two-phase cooling in cold plates refers to a coolant in liquid and gas states.

In general, exemplary embodiments of the invention provide a cold plate with enhanced cooling performance by minimizing the reduction of coolant flow in parallel flow paths caused by differing vapor percent in the paths due to uneven spatial and/or temporal heat loading on the cold plate. Exemplary embodiments of the invention provide micro-channel cold plates having parallel paths and spaced orifices to facilitate balanced coolant flow in the hydraulically parallel paths in the presence of varying heat loads.

A first orifice is sized such that, under nominal balanced flow conditions, the pressure drop incurred will not cause flashing. A second orifice is sized to flash the subcooled liquid to a two-phase flow. If the heat load on a given parallel path decreases, the resultant increase in liquid flow through that path causes flashing through the first orifice, which results in a two-phase mixture being supplied to the second orifice. This causes an increase in the pressure drop at the first orifice and a significant increase in the pressure drop at the second orifice. The increased pressure losses through the orifices offsets the reductions in downstream pressure drop due to the reduced exit quality for preventing misdistribution of flow.

The presence of the flashing orifice can provide the added benefit of improved thermal performance and increased heat flux dissipation capability.

As used herein, parallel paths or channels means parallel from a hydraulic standpoint. This may include any combination of parallel-series construction or fractal network to achieve an optimized design for a given application geometry and heat loading conditions. As used herein, micro-channel is defined as any channel with micron-scale dimensions (i.e., <1 mm hydraulic diameter) where parallel hydraulic arrangement is typically required to dissipate heat over large areas.

The orifices passively effect robust flow distribution to parallel micro-channel heat sinks under varying spatial and/or temporal load. Cold plates can be fabricated to allow the orifices to be integrated into a large-scale, fully scalable monolithic cold plate. It is understood that the orifices can be relatively long or short and can be fabricated from suitable materials having a relatively high hardness. The particular number, spacing, material, and geometry of the orifices can vary to meet the needs of a particular application.

Figure 3:
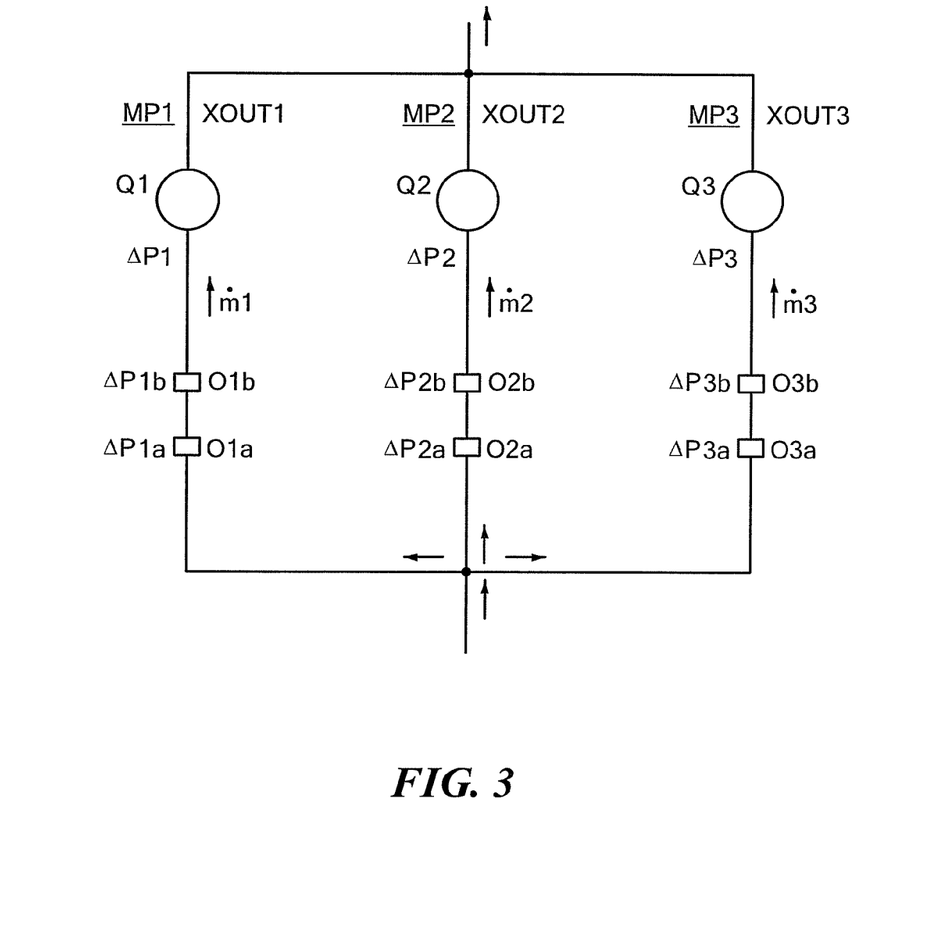
FIG. 3 is a schematic representation a cold plate having parallel flow paths with respective sets of orifices in accordance with exemplary embodiments of the invention.

FIG. 3 shows first, second, and third flow paths MP1, MP2, MP3, all of which are hydraulically parallel. Each path MP1, MP2, MP3 has a respective pressure drop $\Delta P1$, $\Delta P2$, $\Delta P3$, heat load Q1, Q2, Q3, and mass flow rate mdot1, mdot2, mdot3. The outlet of each path has a respective vapor quality xout1, xout2, xout3.

The first path MP1 includes a first orifice O1$a$ and a second orifice O1$b$ spaced a given distance from the first orifice. In the illustrated embodiment, the orifices O1$a$, O1$b$ are located on an inlet side of the flow path MP1. The second and third paths MP2, MP3 similarly have respective first orifices O2$a$, O3$a$ and second orifices O2$b$, O3$b$. The first and second orifices O1$a$, O1$b$ of the first flow path MP1 can be considered a first set of orifices, the first and second orifices O2$a$, O2$b$ of the second flow path can be considered a second set of orifices and so on. In general, these orifices can be located close to, or far from, the heat sources of interest, as required for a specific design.

If the first path heat load Q1 is greater than the second and third path heat loads Q2, Q3, slight increases in the second and third path mass flow rates mdot2, mdot3, induce flashing across the first orifices, which results in increased pressure drops $\Delta P2a,b$, $\Delta P3a,b$ across the first and second orifices O2$a,b$, O3$a,b$ in the second and third paths MP2, MP3. This offsets the lower pressure drop $\Delta P2,3$ in the micro-channels due to reduced heating.

If the first path heat load Q1 is less than the second and third heat path loads Q2, Q3, the orifices again bias coolant flow to optimize cooling.

EXAMPLE

Tin=5° C., Pin=0.375 MPa

The first orifice O1$a$, O2$a$, O3$a$ for the paths is sized to result in a pressure drop of 0.02 MPa ($\Delta P1a$, $\Delta P2a$, $\Delta P3a$) at a desired flow rate mdot1, mdot2, mdot3. The second orifice O1$b$, O2$b$, O3$b$ is sized to result in a pressure drop of 0.01 MPa ($\Delta P1b$, $\Delta P2b$, $\Delta P3b$) at a desired flow rate mdot. The quality x at the inlet of the heat loads Q1, Q2, Q3=~0.02. The nominal heat load Q1, Q2, Q3 for the paths is 100 W with pressure drops $\Delta P1$, $\Delta P2$, $\Delta P3$ equal to 0.03 MPa.

If the heat load Q1 in the first path MP1 becomes 0, while the other heat loads Q2, Q3 remain at 100 W, the pressure drop $\Delta P1$ is <0.01 MPa at the desired flow rate mdot1.

With the orifices, a minimal increase in flow rate mdot1, e.g., <<20%, which is orifice design specific, causes a quality x>0 due to flashing prior to the second orifice O1$b$, in turn causing ΔP1b to be >>ΔP2b and ΔP3b. This offsets the reduction in the first path pressure drop ΔP1 and decreases the second and third path mass flow rates mdot2, mdot3 by <<10% to maintain acceptable heat transfer characteristics.

Without orifices, assuming laminar flow, this would result in an increase of between about 20% and 40% for the first path mass flow rate mdot1 and a decrease of between about 10% and 20% for the second and third path mass flow rates mdot2, mdot3. As is known in the art, laminar flow, which is also known as streamline flow, occurs when a fluid flows in parallel layers without disruption between the layers, i.e., laminar flow is 'smooth.'

Figure 3A:
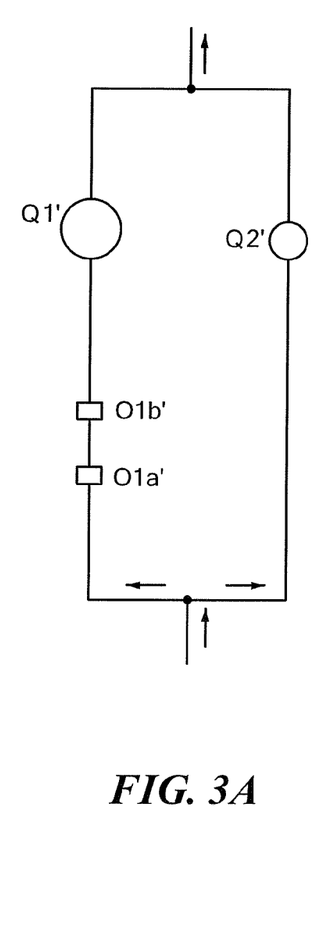
FIG. 3A is a schematic representation of a further embodiment of a cold plate having parallel flow paths.

In an alternative embodiment shown in FIG. 3A only the first flow path includes an orifice O1a', O1b' for a cooling application in which a first heat load Q1' is expected to be to significantly greatly than a second heat load Q2' in the second path. In this configuration, the orifices O1a', O1b' can prevent flow starvation in the non-orificed path and/or large pressure-drop induced thermal gradients caused by having excessive mass flow.

Figure 4:
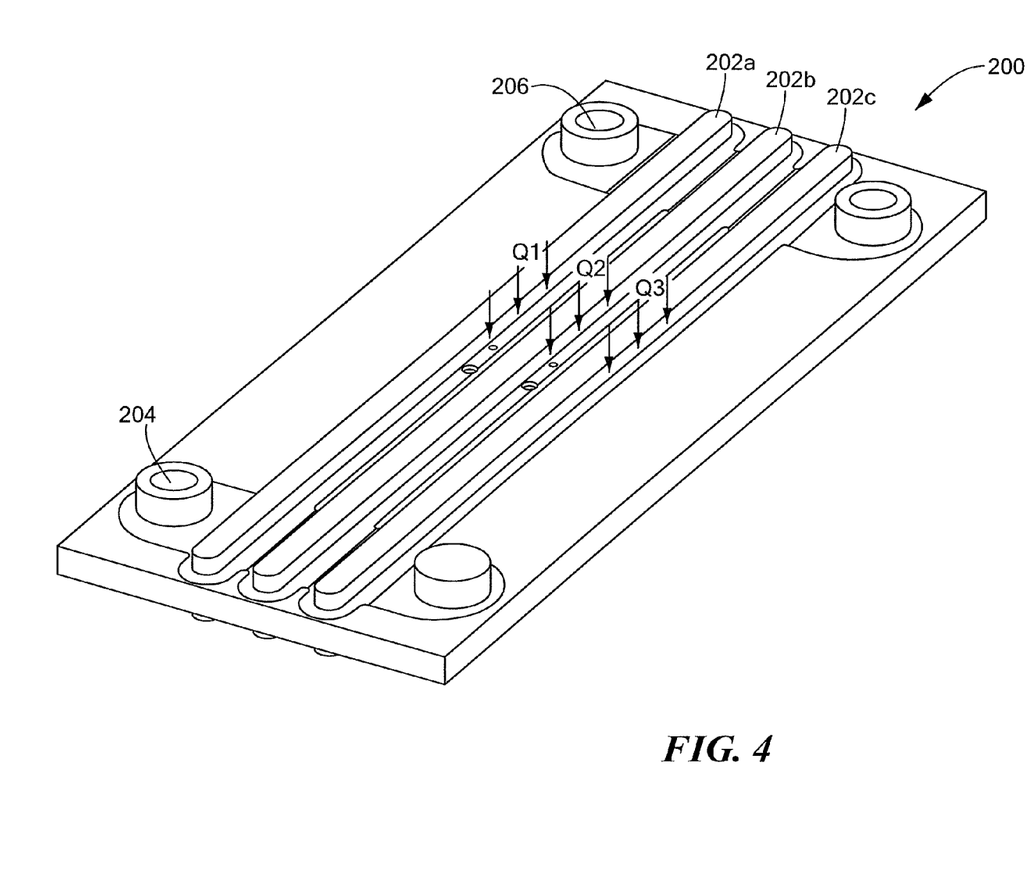
FIG. 4 is a schematic representation of a cold plate having parallel flow paths for cooling respective heat loads.

FIG. 4 shows an exemplary cold plate 200 having first, second, and third micro-channel flow paths 202a, b, c. A liquid coolant is supplied under pressure via an inlet 204 to the flow paths 202 and a liquid/vapor mixture is returned via an outlet 206 after cooling the heat loads Q1, Q2, Q3. The cold plate 200 is well suited for cooling circuit card assemblies and other units that generate heat. It is understood that any practical number of inlets and outlets can be used to meet the needs of a particular application.

Figure 5A:
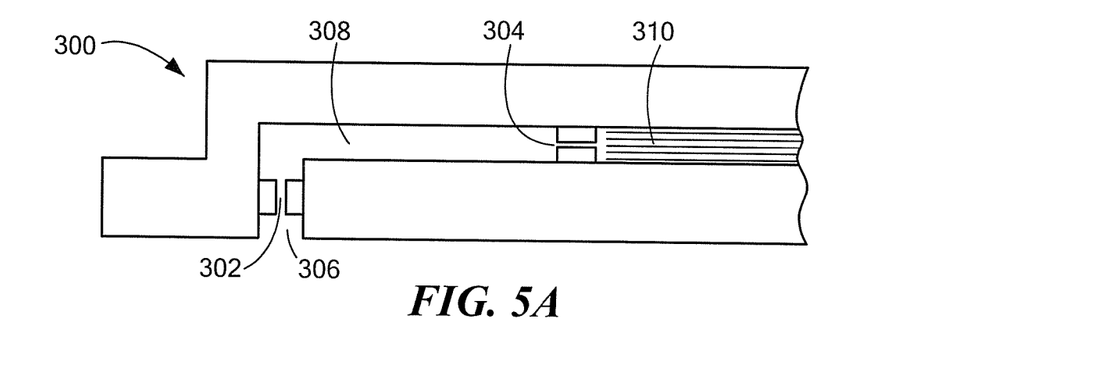
FIG. 5A is a schematic representation of a flow path having a first orifice and a second orifice in accordance with exemplary embodiments of the invention.

FIG. 5A is a cutaway partial side view of an exemplary cold plate 300 including a first orifice 302 and a second orifice 304 spaced from the first orifice. The first orifice 302 is placed proximate an inlet 306 of a first flow path 308 and the second orifice 304 is placed proximate the micro-channels 310.

Figure 5B:
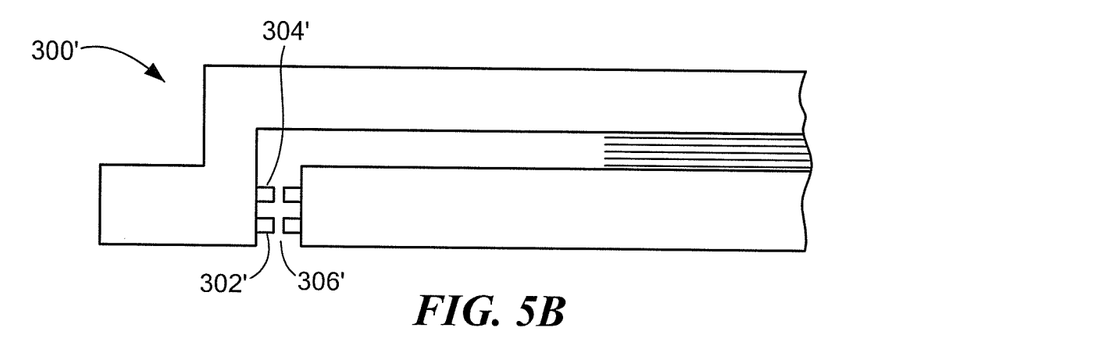
FIG. 5B is a schematic representation of an alternative flow path having a first orifice and a second orifice in accordance with exemplary embodiments of the invention.

In an alternative embodiment shown in FIG. 5B, a cold plate 300' includes a first orifice 302' and a second orifice 304' placed relatively close together near an inlet 306'.

Figure 6A:
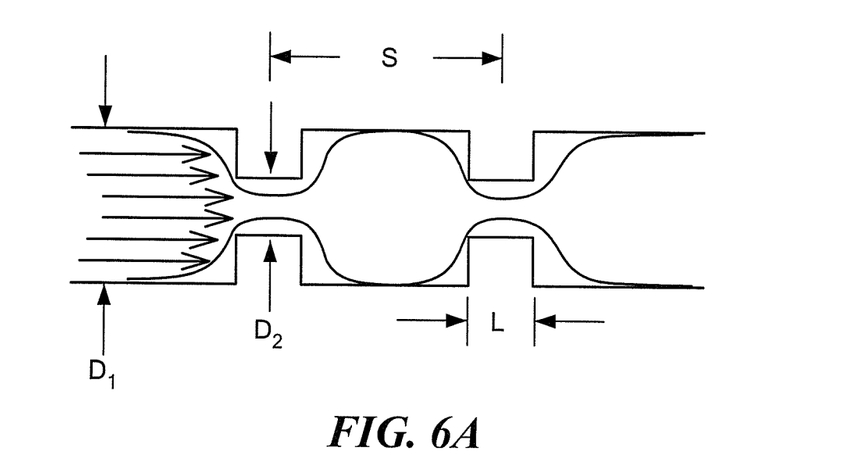
FIGS. 6A and 6B are schematic representations of exemplary flow path illustrating orifice spacing and sizing.
Figure 6B:
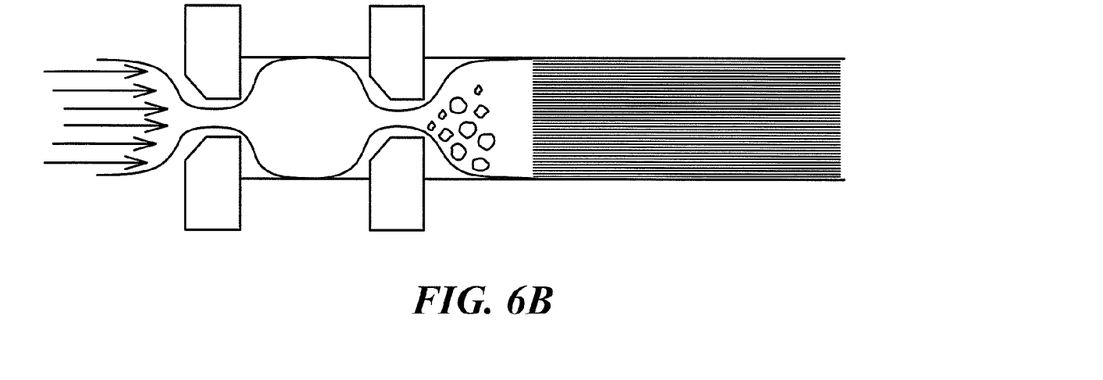

It is understood that orifice spacing and structure can be varied to meet the needs of a particular application. In general, small orifice spacings (e.g., S/D1<~10), as shown in FIG. 6A, can fit within compact spaces. However, increased hydrodynamic interactions between orifices may complicate behavior. Large spacings (e.g., S/D1>~10), as shown in FIG. 6B, may facilitate decoupling of orifice flow characteristics to improve predictability.

A variety of known fabrication processes can be used to achieve desired orifice geometries, including with D2, L (FIG. 6A) and leading edge geometry to achieve desired characteristics. Illustrative processes to provide orifices in the flow paths include drilled threaded or press-fit inserts with circular holes and machined, or lithographically patterned, rectangular slots.

Figure 7:
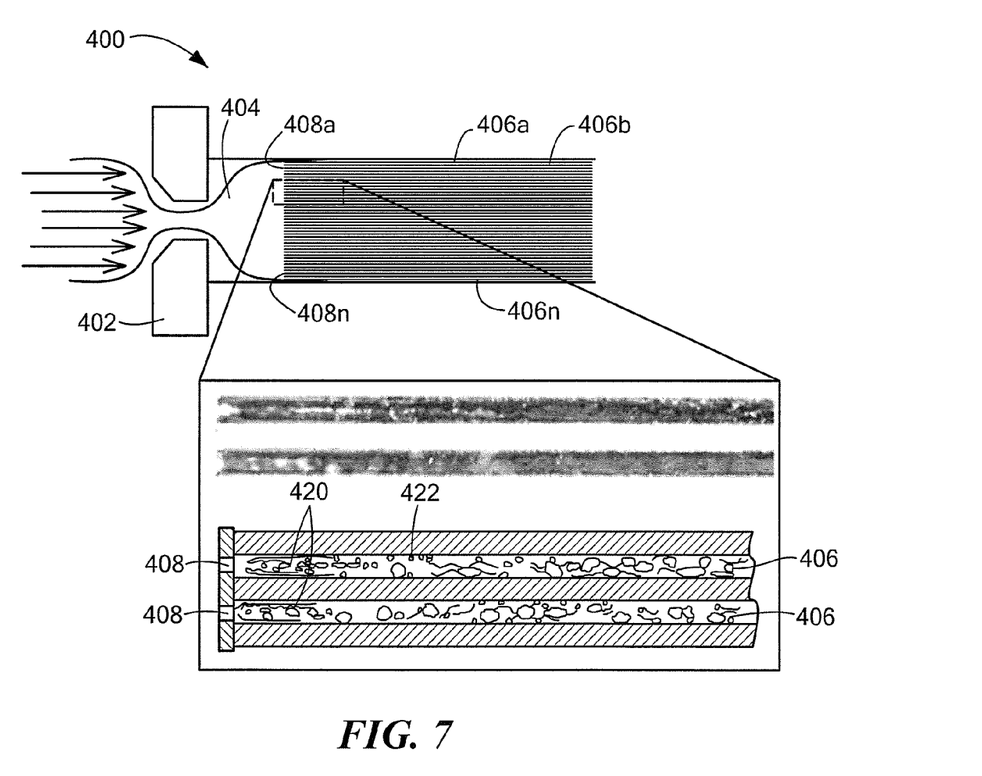
FIG. 7 is a schematic representation of a further flow path illustrating orifice spacing and sizing with additional detail of micro-channels.

FIG. 7 shows a further embodiment of a cold plate 400 in accordance with exemplary embodiments of the invention. A first orifice 402 in the flow path provides flow into a region 404 coupled to a series of micro-channels 406a-n, each having a respective second orifice 408a-n located at the inlet of each micro-channel. Flashing bubbles 420 and bubbles 422 on the channel surface can be generated in use, as shown.

Figure 7A:
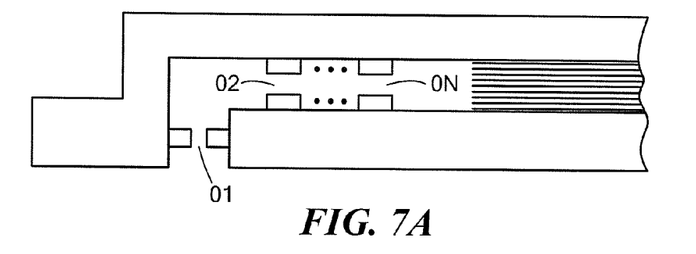
FIG. 7A is a schematic representation of a further flow path showing more than two orifices.

It is understood that an inventive cold plate can have any practical number of paths to meet the needs of a particular cooling application. It is further understood that inventive cold plates can be provided for a variety of pressures, temperatures, and heat loads. In alternative embodiments, more than two orifices in series (O1, O2, . . . ON), are used in a flow path as needed to achieve the same passive flow balancing effect, as shown in the exemplary embodiment of FIG. 7A.

Exemplary embodiments of the invention provide flow balancing of cooling fluid to enable the application of high performance micro-channel phase-change cooling technology to large high power electronic assemblies with spatially and temporally varying thermal loads. Micro-channel cold plates provide low thermal resistance heat rejection, especially under high heat fluxes when using two-phase coolants. Inventive embodiments of micro-channel cold plates with a passive multi-orifice flow regulation scheme can be readily integrated into large-scale monolithic cold plate assemblies with "n" parallel micro-channel flow paths. The inventive flow regulation scheme significantly increases the robustness of highly parallel micro-channel-based phase change cooling in electronics assemblies with varying heat loads, such as active electronically steered array (AESA) radars.

Figure 8A:
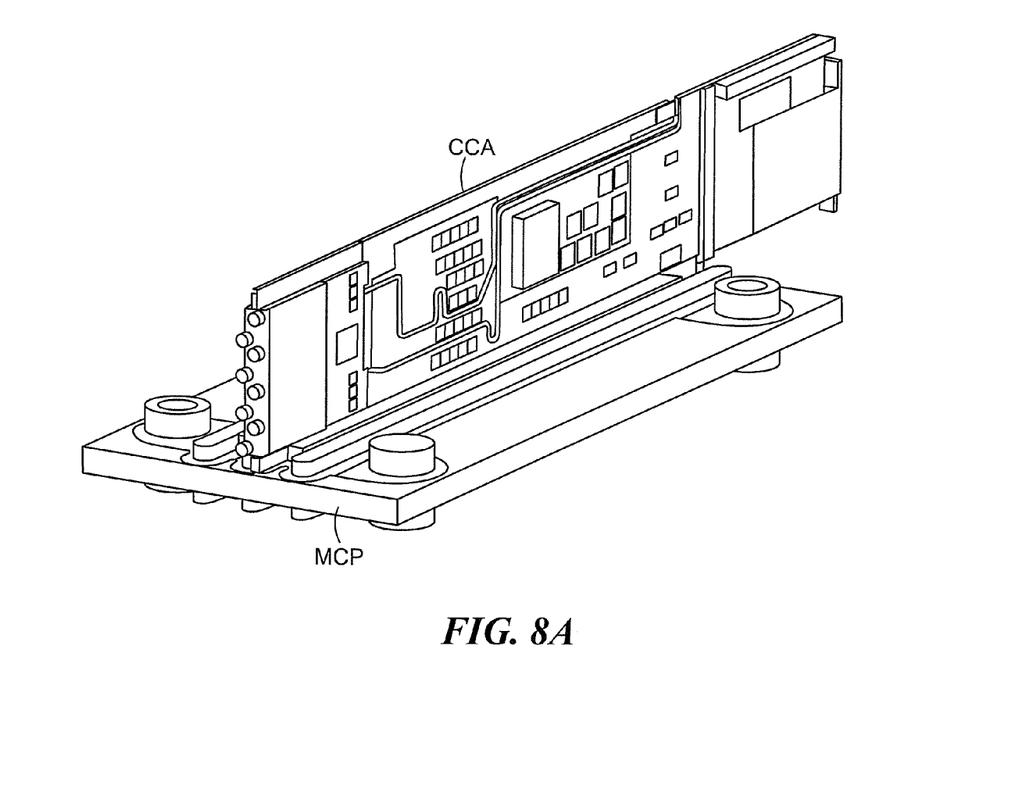
FIG. 8A is a schematic representation of a circuit card assembly coupled to a micro-channel cold plate in accordance with exemplary embodiments of the invention.

FIG. 8A shows an exemplary circuit card assembly CCA thermally coupled to a micro-channel cold plate MCP in accordance with exemplary embodiments of the invention. The circuit card assembly CCA can slide into a card slot to provide contact with the cold plate MCP during operation.

Figure 8B:
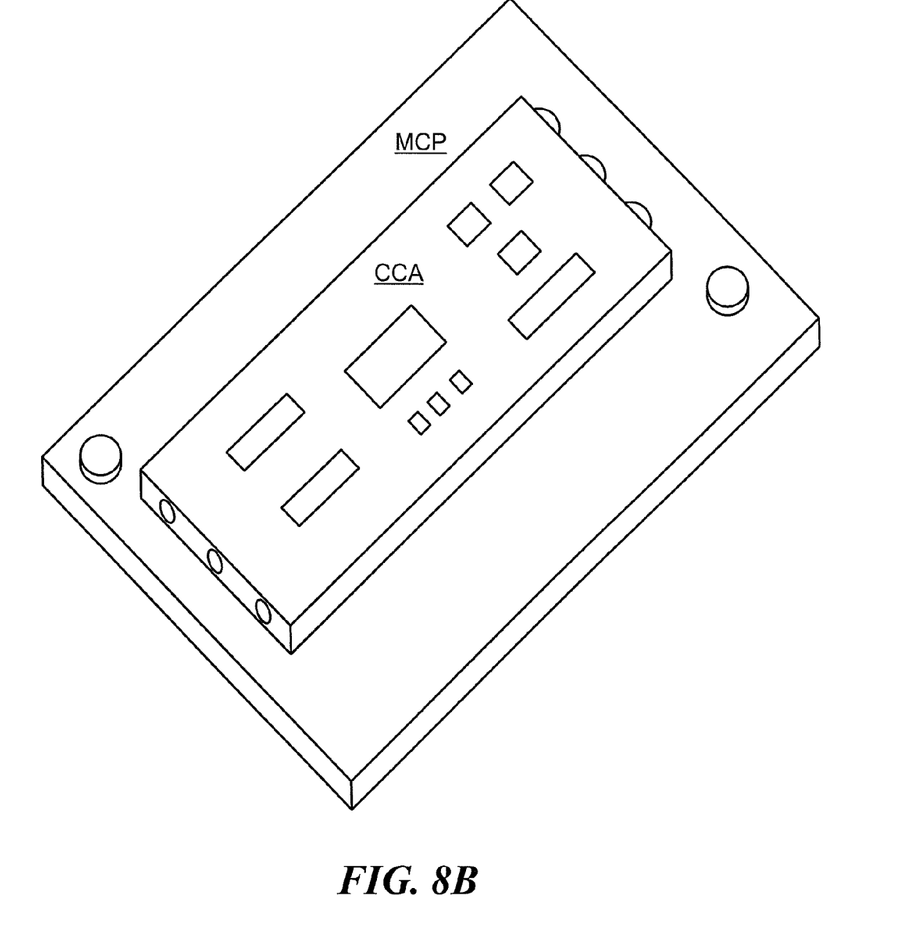
FIG. 8B is a further schematic representation of a circuit card assembly coupled to a micro-channel cold plate in accordance with exemplary embodiments of the invention

It is understood that the orientation of the circuit card assembly CCA with respect to the cold plate MCP can vary to provide a desired contact surface area between the circuit card assembly and the cold plate to meet the needs of a particular application. For example, a circuit card assembly top and/or bottom surface can be placed on cold plate(s), as shown in FIG. 8B.

Figure 9A:
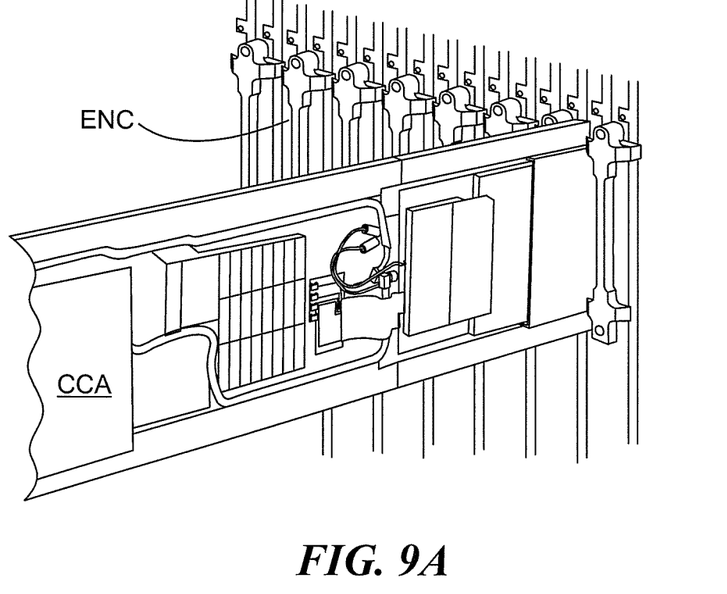
FIG. 9A is a pictorial representation of a circuit card assembly that can form a part of an enclosure shown in FIG. 9B having micro-channel cold plates to cool the circuit card assemblies in accordance with exemplary embodiments of the invention.
Figure 9B:
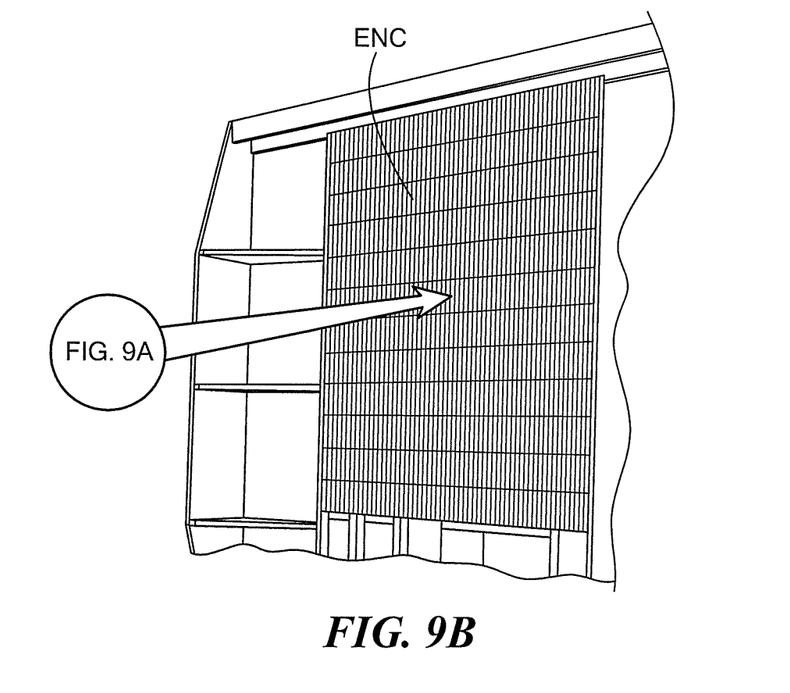

FIGS. 9A and 9B show a circuit card assembly CCA that is removably insertable into an enclosure ENC for holding a number of circuit card assemblies, each of which can be thermally coupled to micro-channel cold plates within the enclosure. The enclosure can form part of a phased array radar, for example. In general, inventive embodiments of a micro-channel cold plate can form a part of a rack for a computer, storage, and the like, in which it is desirable to cool a circuit card assembly.

Figure 10:
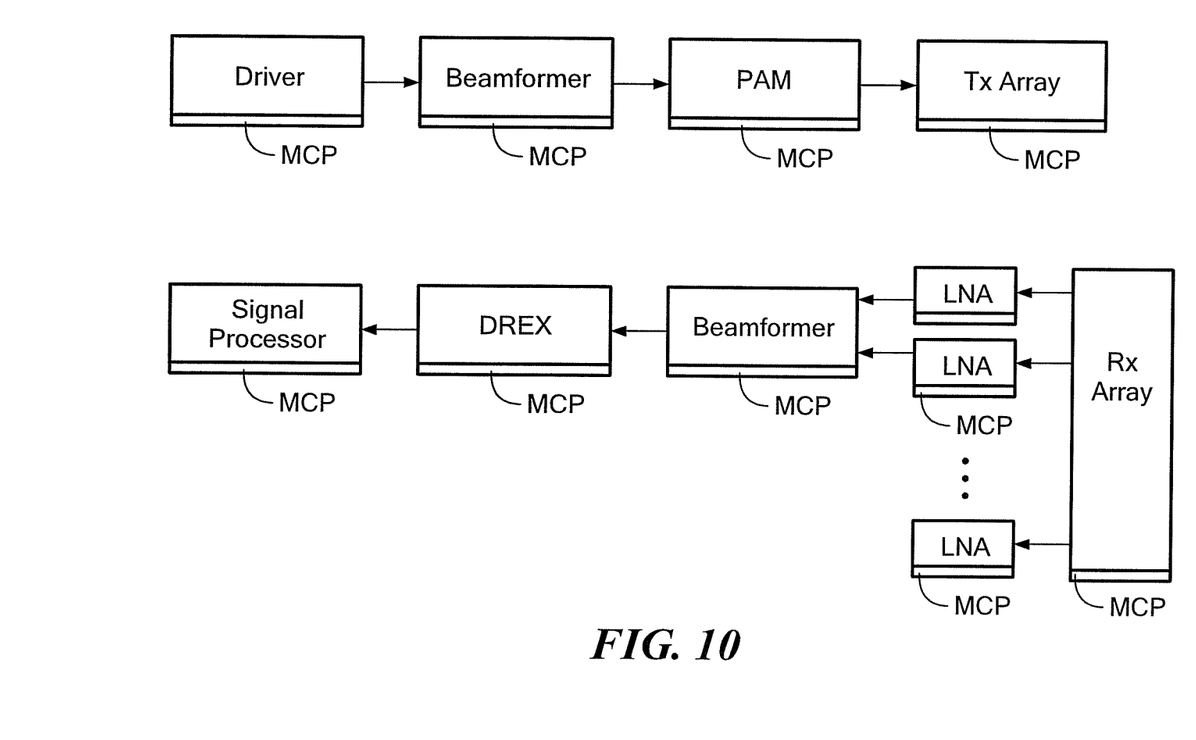
FIG. 10 is a schematic representation of a radar system having micro-channel cold plates to cool receive and transmit components of the system in accordance with exemplary embodiments of the invention.

FIG. 10 shows an exemplary radar system having transmit and receive arrays. The transmit system includes a driver, beamformer, power amplifier module, and transmit array. The receive system includes a signal processor, a digital receiver, a beamformer, low noise amplifiers, and receive array. Each of the transmit and receive system components can include one or more micro-channel cold plates in accordance with the present invention.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A cold plate system, comprising:
a common inlet and a common outlet;
first and second flow paths being hydraulically parallel between the common inlet and the common outlet, wherein the first and second flow paths enable two-phase coolant flow under pressure through micro-channels for cooling heat loads on the cold plate system;
the first flow path having a first inlet coupled to the common inlet, a first outlet coupled to the common outlet, and first and second orifices located between the first inlet and the first outlet, wherein the first orifice is spaced from the second orifice in the first flow path, the first and second orifices disposed in the first flow path on an inlet side of the first flow path, wherein the first and second orifices each protrude into the first flow path to reduce a cross-sectional area of the first flow path for constricting flow of the coolant;
a third orifice spaced from a fourth orifice, the third and fourth orifices disposed in the second flow path on an inlet side of the second flow path;
wherein the first and second orifices in the first flow path and the third and fourth orifices in the second flow path minimize a difference in mass flow rate between the first and second flow paths when the first and second flow paths are exposed to different heat loads; and
a first card slot aligned with the first flow path to cool a first circuit card assembly seated in the first card slot and a second card slot aligned with the second flow path to cool a second circuit card assembly.

2. The system according to claim 1, wherein the cold plate system is passive.

3. The system according to claim 1, wherein for a selected temperature and pressure, the first orifice is sized to not cause flashing of the liquid coolant and the second orifice is sized to flash subcooled liquid coolant to a two-phase flow.

4. The system according to claim 1, further including a further orifice in the first flow path.

5. The system according to claim 1, wherein the second orifice is located at an inlet to a micro-channel.

6. The system according to claim 1, further including a slot for coupling the cold plate system to a circuit card.

7. The system according to claim 6, wherein the circuit card forms a part of a radar system.

8. The system according to claim 6, wherein the circuit card forms a part of a computer.

9. The system according to claim 1, wherein the first and second orifices are spaced to minimize the difference in mass flow rate between the first and second flow paths when the first and second flow paths are exposed to different heat loads.

10. A cold plate system, comprising:
a first flow path;
a first orifice disposed in the first flow path, the first orifice having a fluid inlet and a fluid outlet into a region, wherein the first orifice protrudes into the first flow path to reduce a cross-sectional area of the first flow path for constricting flow of coolant;
a second orifice disposed at an inlet of a first micro-channel coupled to the region, wherein the second orifice has a cross-sectional area less than the inlet of the first micro-channel to constrict flow of the coolant;
a third orifice disposed at an inlet of a second micro-channel coupled to the region, wherein the third orifice has a cross-sectional area less than the inlet of the second micro-channel to constrict flow of the coolant:
wherein the first flow path and the first and second micro-channels enable two-phase coolant flow under pressure through the first and second micro-channels to minimize a difference in mass flow rate between the first and second micro-channels when the first and second flow micro-channels are exposed to different heat loads; and
a first card slot aligned with the first flow path to cool a first circuit card assembly seated in the first card slot and a second card slot aligned with the second flow path to cool a second circuit card assembly.

11. The system according to claim 10, wherein the first and second micro-channels are sized to generate flashing bubbles to maximize cooling for a selected pressure and temperature.

12. The system according to claim 10, wherein the first and second micro-channels are hydraulically parallel.

13. The system according to claim 10, wherein the system is passive.

14. The system according to claim 10, farther including a slot for coupling the cold plate system to circuit card.

15. A cold plate system, comprising:
first and second flow paths extending from a common inlet to a common outlet, the first and second flow paths being hydraulically parallel, wherein the first and second flow paths enable two-phase coolant flow under pressure through micro-channels for cooling heat loads on the cold plate system;
a first orifice spaced from a second orifice, the first and second orifices disposed in the first flow path on an inlet side of the first flow path, wherein the first and second orifices each protrude into the first flow path to reduce a cross-sectional area of the first flow path for constricting flow of the coolant;
wherein the first flow path is configured to cool a first heat load and the second flow path is configured to cool a second heat load, Which is less than the first heat load, wherein the first and second orifices in the first flow path minimize a difference in mass flow rate between the first and second flow paths, wherein the first flow path has a first inlet coupled to the common inlet, a first outlet coupled to the common outlet, and first and second orifices located between the first inlet and the first outlet, wherein the first orifice is spaced from the second orifice in the first flow path; and
a first card slot aligned with the first flow path to cool a first circuit card assembly seated in the first card slot and a second card slot aligned with the second flow to cool a second circuit card assembly 16. The cold plate system according to claim 15, wherein the cold plate system is passive.

17. The cold plate system according to claim 15, further including a slot for coupling the cold plate system to a circuit card.

18. A method, comprising:
providing a common inlet and a common outlet;
providing first, second and third flow paths being hydraulically parallel between the common inlet and the common outlet, wherein the first, second, and third flow paths enable two-phase coolant flow under pressure through micro-channels for cooling heat loads on the cold plate system;
wherein the first flow path has a first inlet coupled to the common inlet, a first outlet coupled to the common outlet, and first and second orifices located between the first inlet and the first outlet, wherein the first orifice is spaced from the second orifice in the first flow path, the first and second orifices disposed in the first flow path on an inlet side of the first flow path, wherein the first and second orifices each protrude into the first flow path to reduce a cross-sectional area of the first flow path for constricting flow of the coolant; and
providing a third orifice spaced from a fourth orifice, the third and fourth orifices disposed in the second flow path on an inlet side of the second flow path;
providing a fifth orifice spaced from a sixth orifice, the fifth and sixth orifices disposed in the third flow path on an inlet side of the third flow path;
wherein the first, second, third, fourth, fifth, and sixth orifices in the first, second, and third flow paths minimize a difference in mass flow rate between the first, second, and third paths when the first, second, and third flow paths are exposed to different heat loads,
configuring the first, second, and third flow paths and the coolant for a given first heat load for the first path, second heat load for the second path, and third heat load for the third path such that the first heat load being greater than the second and third heat loads increases mass flow rates in the second and third flow paths to induce flashing across the third orifice in the second flow path and the fifth orifice in the third flow path, which increases pressure drops across the third and fourth orifices in the second flow path and the fifth and sixth orifices in the third flaw path.

19. The method according to claim 18, further including sizing the first orifice such that under nominal balanced flow conditions a given pressure drop will not cause flashing.

20. The method according to claim 19, further including sizing the second orifice to flash subcooled coolant to a two-phase flow.

* * * * *